US012031210B2

(12) United States Patent
Miller et al.

(10) Patent No.: US 12,031,210 B2
(45) Date of Patent: Jul. 9, 2024

(54) SYSTEM AND METHOD FOR ATOMIC LAYER DEPOSITION OF RARE-EARTH OXIDES ON OPTICAL GRADE MATERIALS FOR LASER GAIN MEDIA (71) Applicant: Lawrence Livermore National Security, LLC, Livermore, CA (US)

(72) Inventors: John S. Miller, Walnut Creek, CA (US); Selim Elhadj, Livermore, CA (US); Thomas M. Spinka, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 16/988,217

(22) Filed: Aug. 7, 2020

(65) Prior Publication Data
US 2022/0042172 A1 Feb. 10, 2022

(51) Int. Cl.
*C23C 16/455* (2006.01)
*C23C 16/40* (2006.01)

(52) U.S. Cl.
CPC ...... *C23C 16/45555* (2013.01); *C23C 16/403* (2013.01); *C23C 16/45536* (2013.01); *C23C 16/45544* (2013.01); *C23C 16/45553* (2013.01)

(58) Field of Classification Search
CPC ............ C23C 16/45555; C23C 16/403; C23C 16/45536; C23C 16/45544; C23C 16/45553
See application file for complete search history.

(56) References Cited

U.S. PATENT DOCUMENTS 5,289,081 A * 2/1994 Tamatani ............. C09K 11/025
313/486
5,377,429 A * 1/1995 Sandhu .................... B01D 7/00
118/715

(Continued)

FOREIGN PATENT DOCUMENTS

EP 3050646 A1 8/2016
WO WO2006032982 A1 3/2006
WO WO2007028267 A1 3/2007

OTHER PUBLICATIONS

Binnemans ("Lanthanide-Based Luminescent Hybrid Materials", Koen Binnemans, Chem. Rev. 2009, 109, 4283-4374, accessed online Dec. 16, 2021) (Year: 2009).*

(Continued)

*Primary Examiner* — Michael G Miller
(74) *Attorney, Agent, or Firm* — HARNESS, DICKEY & PIERCE, P.L.C.

(57) ABSTRACT

A method is disclosed for doping a quantity of powder particles. A container having a central chamber is initially charged with a quantity of powder particles. A quantity of precursor is sublimed to form a heated precursor. A quantity of carrier gas is mixed with the precursor to form a mixture of heated precursor/carrier gas. The central chamber is charged with the heated precursor/carrier gas and then moved to cause interaction of the powder particles with the heated precursor/carrier gas to form a first monolayer coating on the powder particles. The heated precursor/carrier gas is then removed from the central chamber and the central chamber is charged with a O2/O3 gas under a plasma. The central chamber is then further moved to produce interaction of the O2/O3 gas with the first monolayer coating on the powder particles to modify the first monolayer coating to create a different, single monolayer coating forming an oxide coating on the powder particles.

16 Claims, 7 Drawing Sheets

(56) References Cited

U.S. PATENT DOCUMENTS

| | | | |
|---|---|---|---|
| 5,876,683 A | 3/1999 | Glumac et al. | |
| 2002/0119247 A1* | 8/2002 | Park | C09K 11/584 |
| | | | 427/216 |
| 2003/0077446 A1 | 4/2003 | Yeh et al. | |
| 2007/0182037 A1* | 8/2007 | Rabinovitch | C04B 35/44 |
| | | | 264/1.1 |
| 2007/0237697 A1* | 10/2007 | Clark | C23C 16/45531 |
| | | | 423/263 |
| 2010/0264809 A1* | 10/2010 | Winkler | C09K 11/025 |
| | | | 313/483 |
| 2011/0200822 A1* | 8/2011 | Detavernier | C01F 17/218 |
| | | | 423/21.1 |
| 2012/0025236 A1* | 2/2012 | Galvez | C04B 41/009 |
| | | | 257/98 |
| 2017/0137940 A1* | 5/2017 | Zeberoff | C23C 16/4412 |
| 2019/0062914 A1 | 2/2019 | King et al. | |

OTHER PUBLICATIONS

Gordon ("Overview of ALD Precursors and Reaction Mechanisms", Roy Gordon, 2011, accessed online Nov. 15, 2021) (Year: 2011).*
"Transition Metal" (https://www.britannica.com/print/article/602775 accessed online Nov. 17, 2021) (Year: 2020).*
Adhikari, S., Selvaraj, S. and Kim, D. H. "Progress in powder coating technology using atomic layer deposition." Advanced Materials Interfaces, 5 (2018), p. 1800581.
Ronn, John et al. "Atomic layer engineering of Er-ion distribution in highly doped $Er.Al_2O_3$ for photoluminescence enhancement." ACS Photonics 3.11 (2016), pp. 2040-2048.
International Search Report and Written Opinion, International Application No. PCT/US2021/035143 dated Oct. 21, 2021.
Extended European Search Report, European Patent Application No. 21854239.7 dated Jan. 16, 2024, 10 pages.

* cited by examiner

| Process Parameters | |
|---|---|
| Plasma Power W | 50 |
| Chamber Temperature (°C) | 220 |
| Bubbler Temperature (°C) | 180 |
| #Nd of Doses | 2 |
| Dose Time (s) | 5 |
| Hold Time (s) | 45 |
| Dose Pressure (T) | 4 |
| # of Ozone Doses | 1 |
| Dose Time (s) | .5 |
| Hold Time (s) | 1.5 |
| Dose Pressure (s) | 60 |
| #Cycles | 750 |

SYSTEM AND METHOD FOR ATOMIC LAYER DEPOSITION OF RARE-EARTH OXIDES ON OPTICAL GRADE MATERIALS FOR LASER GAIN MEDIA

STATEMENT OF GOVERNMENT RIGHTS

The United States Government has rights in this invention pursuant to Contract No. DE-AC52-07NA27344 between the U.S. Department of Energy and Lawrence Livermore National Security, LLC, for the operation of Lawrence Livermore National Laboratory.

FIELD

The present disclosure relates to systems and methods for coating powder particles, and more particularly to a system and method that makes use of a modified atomic layer deposition operation to dope powder particles with optically active materials (i.e. Nd, Yb, Er, etc.) with a desired level of dopant.

BACKGROUND

The statements in this section merely provide background information related to the present disclosure and may not constitute prior art.

Single crystal growth and processing of laser disks is expensive and has long lead times for experiments. Sintering powders allow for faster processing disk laser media for example, but there are limitations on the doping concentrations available from manufacturers and custom doped powders are typically only available in small quantities and are long lead time via traditional synthesis routes. Fast prototyping of new materials is critical for developing new laser disk materials for high energy lasers, or for developing and manufacturing other optoelectronics components although present day systems and methods do not provide for the needed fast prototyping.

SUMMARY

This section provides a general summary of the disclosure, and is not a comprehensive disclosure of its full scope or all of its features.

In one aspect the present disclosure relates to a method of doping a quantity of powder particles. The method may comprise filling a container having a central chamber with a quantity of powder particles, and then heating a quantity of precursor to sublime the precursor. The method may further include mixing a quantity of carrier gas with the heated precursor to form a mixture of heated precursor/carrier gas. The method may further include charging the central chamber with the heated precursor/carrier gas and causing movement of the chamber to cause interaction of the powder particles with the heated precursor/carrier gas to form a first monolayer coating on each of the powder particles. The method may include removing the heated precursor/carrier gas from the central chamber and charging the central chamber with a $O_2/O_3$ gas) under a plasma. The method may include causing further movement of the central chamber to produce interaction of the $O_2/O_3$ gas) with the first monolayer coating on each powder particle to modify the first monolayer coating to create a different, single monolayer coating forming an oxide coating on each of the powder particles.

In another aspect the present disclosure relates to a method of doping a quantity of nano-powder particles. The method may comprise filling a container having a central chamber with a quantity of nano-powder particles, and then heating a quantity of optically active precursor to cause sublimation, to thus form a heated organometallic precursor. The method may further include mixing a quantity of carrier gas with the heated optically active precursor to form a mixture of heated precursor/carrier gas. The method may further include charging the central chamber with the heated precursor/carrier gas and causing rotation of the chamber to cause interaction of the nano-powder particles with the heated precursor/carrier gas to form a first monolayer coating on each of the nano-powder particles. The method may further include removing the heated precursor/carrier gas from the central chamber and charging the central chamber with a $O_2/O_3$ gas) under a plasma. The method may further include causing further rotation of the central chamber to produce interaction of the $O_2/O_3$ gas) with the first monolayer coating on each nano-powder particle to modify the first monolayer coating to create a different, single monolayer coating forming a rare earth oxide dopant coating on each of the nano-powder particles. The method may further include sintering the nano-powder particles to incorporate the rare earth oxide dopant coating into a crystal lattice structure of the host nano-powder material.

In still another aspect the present disclosure relates to a system for doping a quantity of powder particles. The system may comprise a container having a central chamber at least partially filled with a quantity of powder particles. A bubbler may be included for heating a quantity of precursor to sublime to precursor and form a heated precursor. The bubbler receives and mixes a quantity of carrier gas with the heated precursor to form a mixture of heated precursor/carrier gas. The central chamber of the container is configured to receive the heated precursor/carrier gas and to be moved to cause interaction of the powder particles with the heated precursor/carrier gas to form a first monolayer coating on each of the powder particles. The system is further configured such that the heated precursor/carrier gas is removed from the central chamber and then the central chamber is charged with a $O_2/O_3$ gas) under a plasma. The system is configured to cause further movement of the central chamber to produce interaction of the $O_2/O_3$ gas) with the first monolayer coating on each powder particle to modify the first monolayer coating to create a different, single monolayer coating forming an oxide coating on each of the powder particles.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

The present disclosure relates to systems and methods for powder atomic layer deposition ("ALD"). ALD allows for custom doping concentrations to be added to a large bed of powders allowing for customization in the design of laser disks or any other part made by sintering, assembling or packing of powders. This allows for rapid prototyping of new laser materials with faster processing, tailored doping, lower cost, and could allow for non-equilibrium doping beyond ambient miscibility levels while maintaining homogenous dopant distribution in a part (i.e., enabling non-equilibrium dopant consideration that could not be produced by conventional powder synthesis).

ALD is a thin film deposition technique for coating high aspect ratio materials with high surface-to-volume ratios with unique thickness control down to the monolayer, which is a key for the fine tuning of the stoichiometry to prevent formation of atomic defects. The ALD technique utilizes two reactive gases pumped in and out of a reactor sequentially to conformally coat high-aspect ratio materials such as powders, trenches, and nanowires. However, not until the work by the co-inventors of the present disclosure has a plasma-enhanced ALD technique has been successfully utilized for coating rare-earth oxides ($Nd_2O_3$, $Er_2O_3$, $Yb_2O_3$, etc.), which are common doping materials in laser gain media and which represent the sources of gain and power, onto nano-powder particles. The co-inventors of the present disclosure have discovered that a modified version of the ALD process can be used to successfully coat the surface of undoped optical powders to provide a dopant/gain source to the underlying nano-powder material. An additional sintering step can be utilized to incorporate the dopant into the crystal phase of the undoped-powder. By adjusting the precursor selection and number of ALD cycles on the nano-powder, the dopant and doping concentration into the nano-powder can be tuned and therefore the gain of the finished material can be tuned as needed for a specific application.

Figure 1:
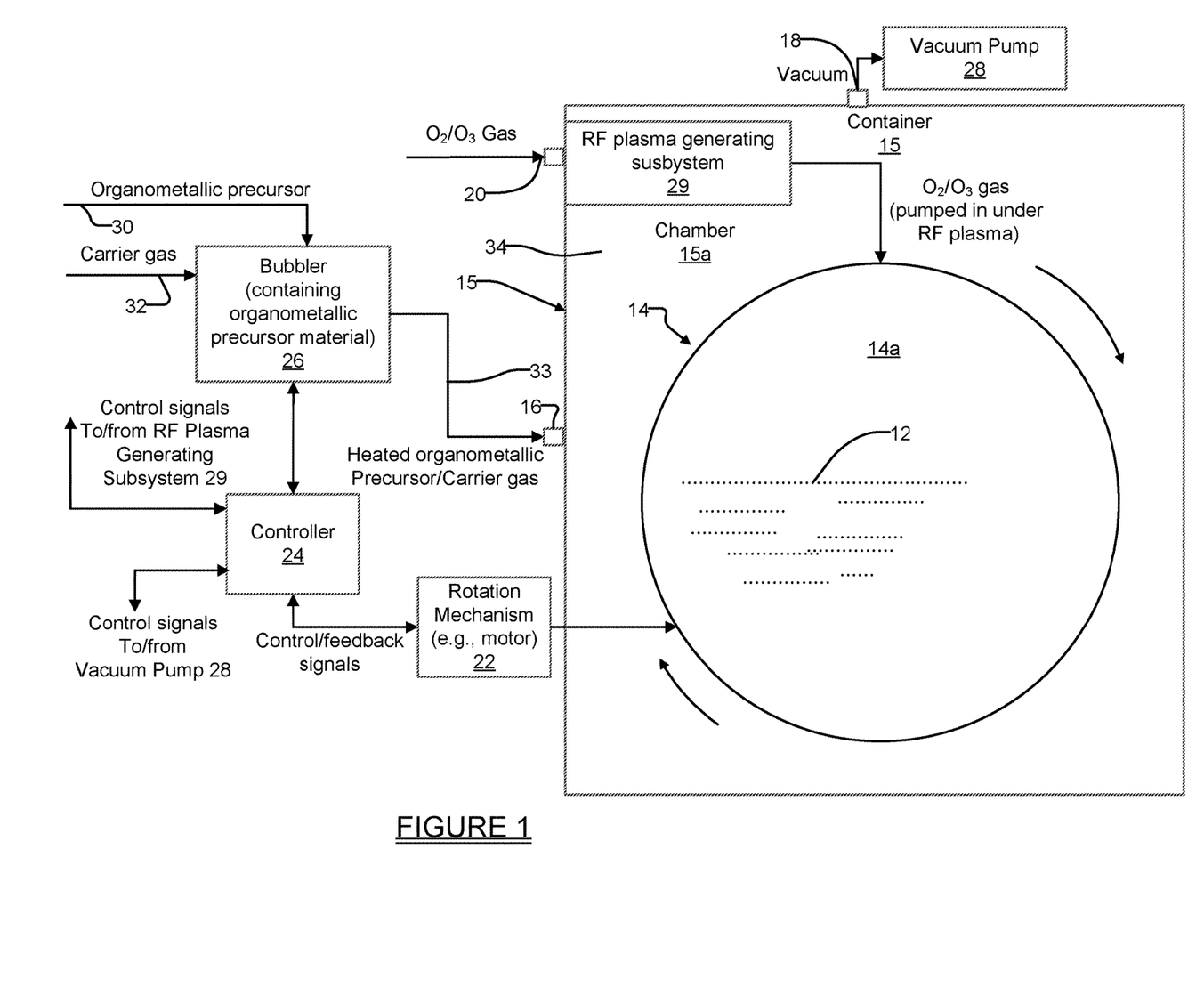
FIG. 1 is a high level block diagram of a powder based atomic layer deposition system in accordance with one embodiment of the present disclosure.

Referring to FIG. 1, a simplified, high level diagram of a system 10 is shown for performing Powder Atomic Layer Deposition ("Powder ALD"). In this example the system 10 utilizes two reactive precursors that are sequentially pumped into and out of the system 10 to stack monolayers of materials on high aspect ratio geometries like powders or nano-powders. In this specific example nano-powders 12 of host materials for optically active precursors (e.g., yttrium aluminum garnet) are initially loaded into a stainless-steel container 14, which in one form comprises a stainless steel cylinder having a central chamber 14a inside of it. It will be appreciated however that a wide range of other precursors could be used, for example halogenated precursors, and therefore the present discussion of the system 10 is not limited only to use with optically active precursors.

The stainless steel cylinder 14 is located inside of a chamber 15a of a container 15. For convenience, the stainless steel cylinder 14 will be referred to throughout the following discussion simply as "cylinder 14".

The chamber 15 includes a first valve 16, a second valve 18 and a third valve 20. A mechanism 22 (e.g., suitable motor) is used to cause rotation of the cylinder 14. A controller 24 may be included for controlling rotation of the cylinder 14 and optionally controlling opening and closing of the valves 16, 18 and 20, provided the valves are electronically controlled valves. The controller 24 may also be used to monitor and/or control a temperature of a bubbler 26. In one embodiment the bubbler 26 is a stainless steel bubbler. The cylinder 14 can be driven rotationally using rotation mechanism 22 to create a tumbling effect on the nano-powders 12 inside the cylinder. This breaks up the surface area for the nano-powders 12 so that they can react with precursor materials during use of the system 10. A vacuum pump 28 may be used to create a negative pressure within the chamber 15a of the container 15 during certain phases of operation of the system 10, as will be described in greater detail momentarily. An RF plasma generating subsystem 29 is included for applying a plasma to a received $O_2/O_3$ flow, as will also be described more fully momentarily.

At the very start of a coating operation, the central chamber 14a is first loaded with a quantity of nano-powders 12. The central chamber 14a is then pumped into a rough vacuum via the vacuum pump 28 in preparation for deposition. This may be accomplished by closing the first and third valves 16 and 20 and opening the second valve 18 to place the central chamber 14a in communication with the vacuum pump 28. An organometallic precursor 30 of an optically active material, in this case Nd from a Tris(2,2,6,6-tetramethyl-3,5-heptanedionato)neodymium(III) precursor [Nd(TMHD)3¬,], is then heated in the stainless-steel bubbler 20 so that it sublimes. A carrier gas 32 is pumped into the bubbler 20 while the organometallic precursor 30 is being heated. A desired quantity of the heated mixture of organometallic precursor 30 and a desired quantity of carrier gas 30, which now form a precursor/carrier gas mixture 33, flows into the central chamber 14a and then the first valve 16 is closed. The carrier gas 32 will typically be either argon, nitrogen, or any other gas which is suitable for use as a carrier gas. The heated mixture of organometallic precursor/carrier gas and the nano-powders then begin mixing as the cylinder 14 is rotated.

Rotation of the cylinder 14 occurs continuously. During this time period the heated mixture of precursor/carrier gas 33 and carrier precursor reacts with the surfaces of the particles of nano-powders as the nano-powder particles tumble and are agitated within the central chamber 14a. This interaction causes a monolayer of Neodymium atoms to form on each of the nano-powder particles 12. The process is self-limiting so that once the heated precursor/carrier gas mixture 33 fully reacts with the surfaces of the nano-powder 12 particles, no further reaction can take place.

Once reacted (i.e., at the end of the first desired predetermined time period), the second valve 18 is opened and the vacuum pump 28 is used to pump out the mixture of organometallic precursor/carrier gas 33 from the central chamber 14a. At this point the second valve 18 is closed and the third valve 20 is opened. A desired quantity of $O_2/O_3$ gas) 34 is then pumped into the central chamber 14a under an RF plasma generated by the plasma generating subsystem 29, and the third valve 20 is closed. A power level of the RF plasma may be between 0 watts-300 watts, and in one preferred implementation is about 50 watts. The use of an RF plasma increases the reactivity of the oxygen/ozone precursors (i.e., can atomize the $O_2/O_3$ gas)) and facilitates molecular bond breaking, thus allowing depositions at lower temperatures at higher deposition rates. While the cylinder 14 is rotating the $O_2/O_3$ gas) 34 reacts with the Nd-monolayer to form a single layer of $Nd_2O_3$ on each nano-powder 12 particle. Once the second predetermined time period is expired the cylinder 14 rotation is stopped, and the above process is repeated. The above described process may be repeated a plurality of times so that the layer of $Nd_2O_3$ reaches a desired thickness.

After the rare-earth oxide material is coated onto the surface of the powder a layer of aluminum oxide is coated onto the surface of the powders using the exact same process described herein. This is done to balance the stoichiometry of the Nd and Al atoms in the YAG structure so that there is no phase separation in the sintering step.

Finally, a sintering operation may be performed on the coated nano-powder 12 particles to incorporate the doping material into the crystal lattice of host material. The above-described coating process is shown diagrammatically in FIG. 4.

By changing the precursor and modifying the above described coating cycle, custom dopants and doping concentrations can be applied to the host nano-powders 12. The custom doping concentrations that can be created using the system 10 and the above described operations are especially useful for prototyping polycrystalline laser materials. Thus, while ALD is a well-known process in the industry, it is believed that the above-described modified use, as a method of doping optically active materials (e.g., laser gain media), or for performing other forms of doping in general, is believed to be new.

Figure 2A:
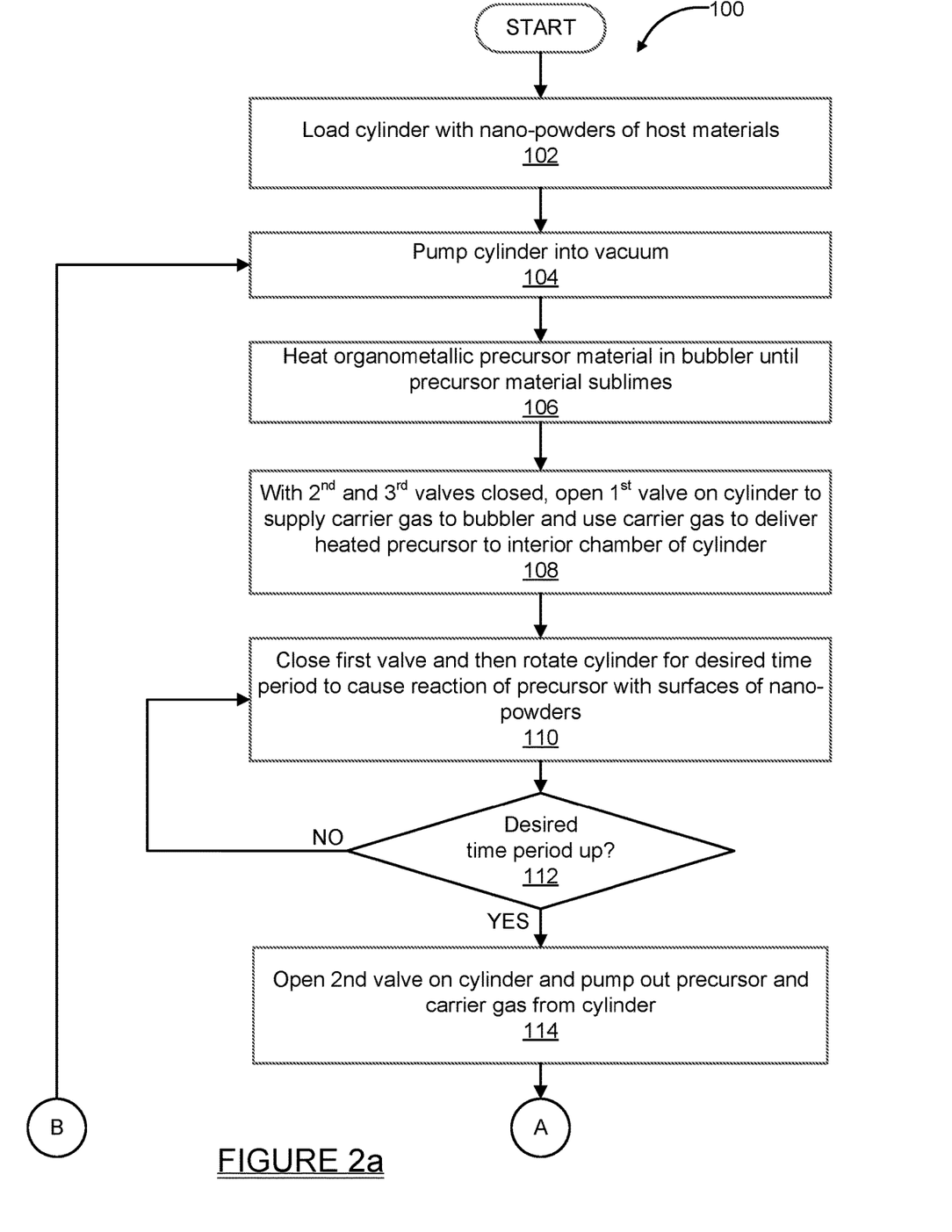
FIGS. 2a and 2b are a flowchart of one example of operations that may be carried out using the system of FIG. 1 to coat surfaces nano-powder particles.
Figure 2B:
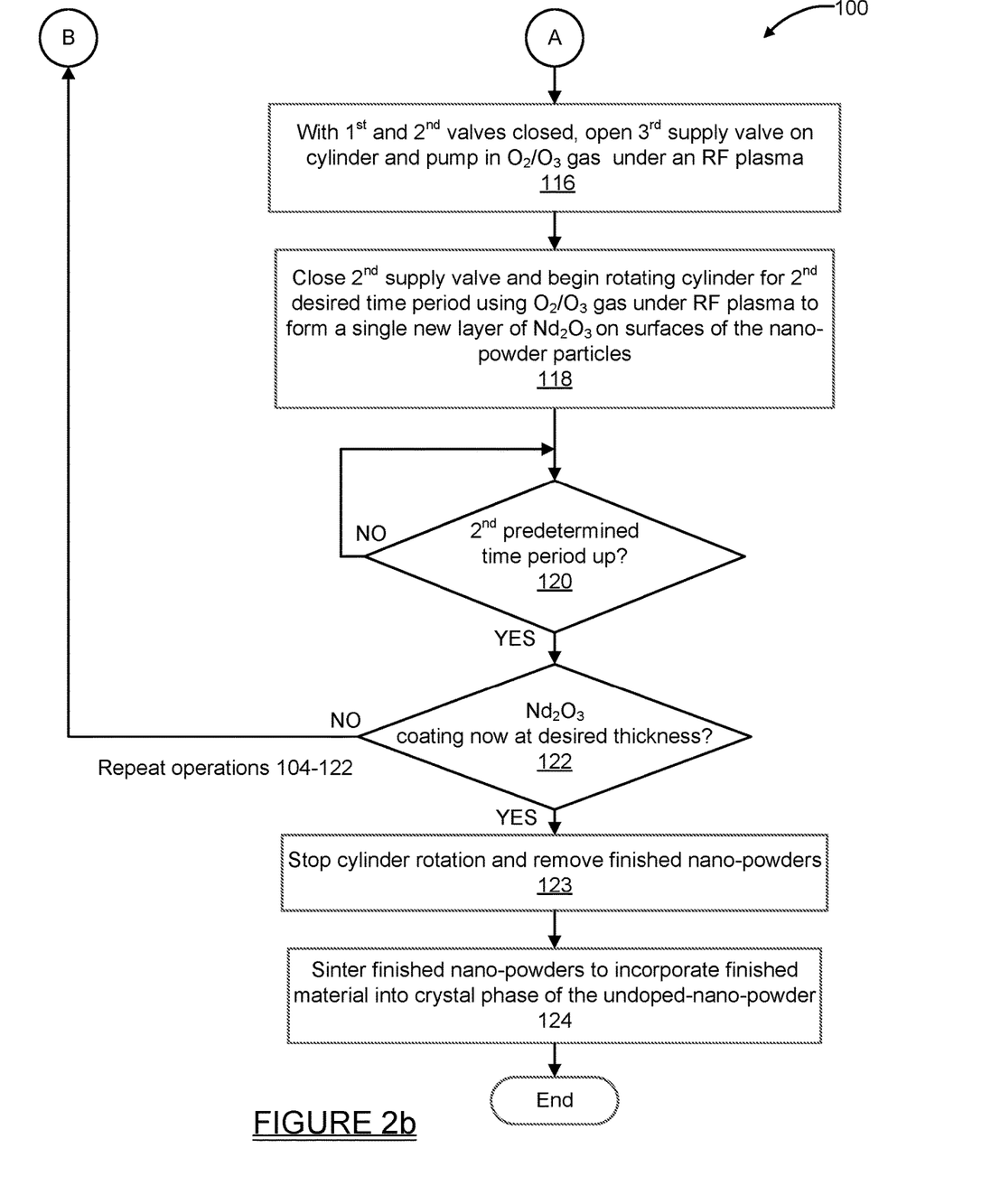

Referring briefly to FIGS. 2a and 2b, various operations summarizing the operation of the system 10 are shown in a flowchart 100. At operation 102 the host nano-powders are initially loaded into the central chamber 14a of the cylinder 14. At operation 104 the cylinder 14 central chamber 14a is then pumped into a vacuum using the vacuum pump 28. At operation 106 the organometallic precursor material 30 may be heated in the bubbler 26. At operation 108, with the second and third valves 18 and 20 closed, the mixture 33 of the carrier gas 32 and the heated organometallic precursor 30 may be pumped into the central chamber 14a. The first valve 16 may then be closed and the cylinder 14 rotated for the first desired time period to cause reaction of the precursor/carrier gas mixture 33 with the surfaces of the nano-powder 12 particles, as indicated at operation 110. The mixing/reaction is performed until the first desired time period is up, as determined at operation 112. At this point the nano-powder particles will have a Nd oxide monolayer and another aluminum oxide to maintain the powder stoichiometry and prevent defect formation from sub-stoichiometric mixing.

The second valve 20 is then opened and the mixture of precursor/carrier gas 33 is pumped out of the central chamber 14a, as indicated at operation 114.

In FIG. 2b, at operation 116, with the first and second valves 16 and 18 now closed, a desired quantity of the $O_2/O_3$ gas) is pumped into the central chamber 14a under an RF plasma. At operation 118, the third valve 20 is then closed and rotation of the cylinder 14. The $O_2/O_3$ gas) under an RF plasma causes a single new surface layer of Nd2O3 to form on each nano-powder 12 particle. The rotation of the cylinder 14 continues until the check at operation 120 indicates that the second time period is up. At this point a check may be made to determine if the nano-powder 12 has a $Nd_2O_3$ coating of a desired thickness, as indicated at operation 122, and if not, the sequence of operations 104-122 may be repeated until the desired coating thickness has been achieved. At that point the check at operation 122 will produce a "Yes" answer, at which point the finished, fully coated nano-powder particles may be removed from the cylinder 14, as indicated at operation 123. The process is then repeated with Aluminum Oxide to balance the stoichiometry of the YAG material. Optionally, the fully coated nano-powder particles may be sintered (e.g., in a suitable furnace) to incorporate the finished nano-powder particles into a crystal phase of the undoped nano-powder, as indicated at operation 124.

Figure 3:
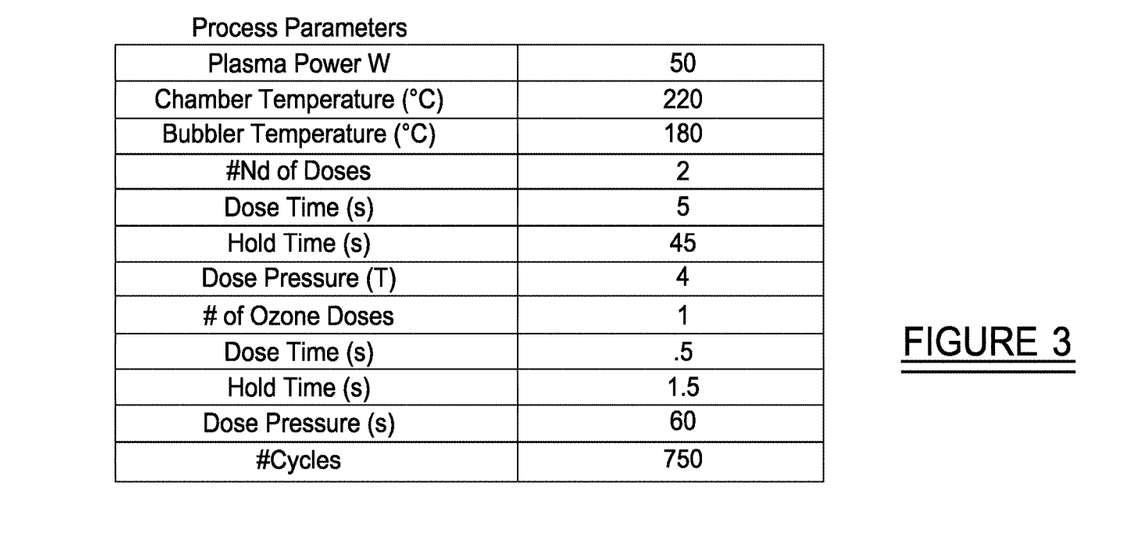
FIG. 3 is a chart of process parameters that were used in tests of the system and method to produce rare earth oxide coated nano-powder particles and summaries of what each parameter represents.

FIG. 3 shows a chart of one example of various process parameters further illustrating the various parameters that may be controlled during use of the system 10.

Figure 4:
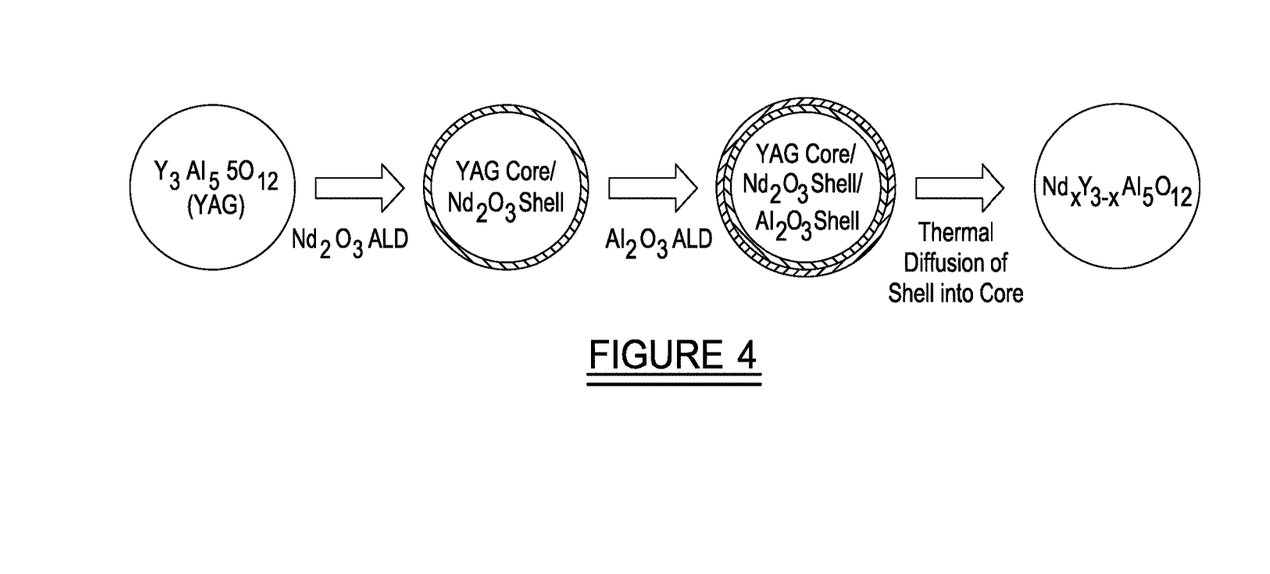
FIG. 4 shows an overview of the process for generating core/shell/shell nanostructures and converting them into a doped powder.

FIG. 4 shows an overview of the structures created, first by doing ALD to form a shell of Nd2O3, and then another shell of Al2O3, and then another step to sinter and form a doped Nd:YAG powder.

Figure 5:
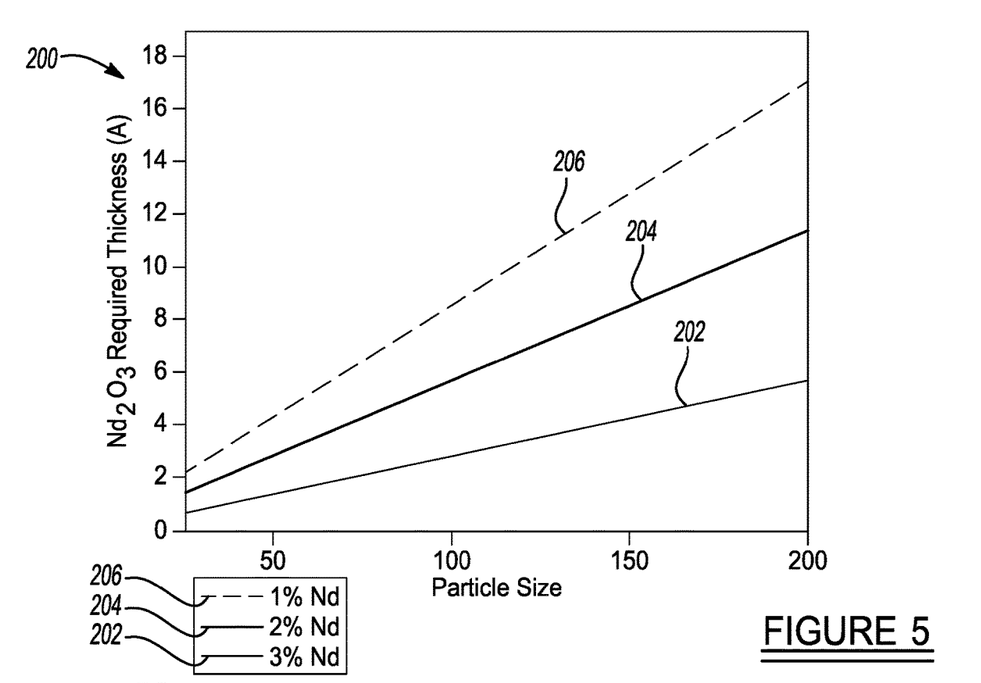
FIG. 5 shows the required dopant thickness as a function of particle size in order to tune the dopant concentration to different dopant levels.
Figure 6:
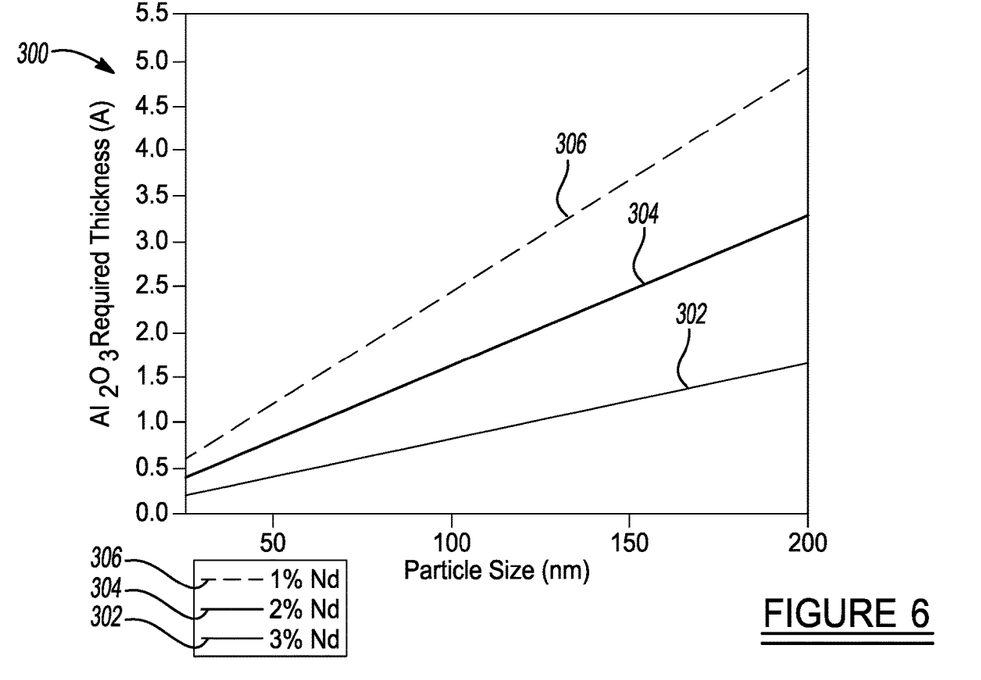
FIG. 6 shows the required aluminum oxide balancing thickness in order to maintain stoichiometry of the doped film as a function of particle size for different doping concentrations.
Figure 7:
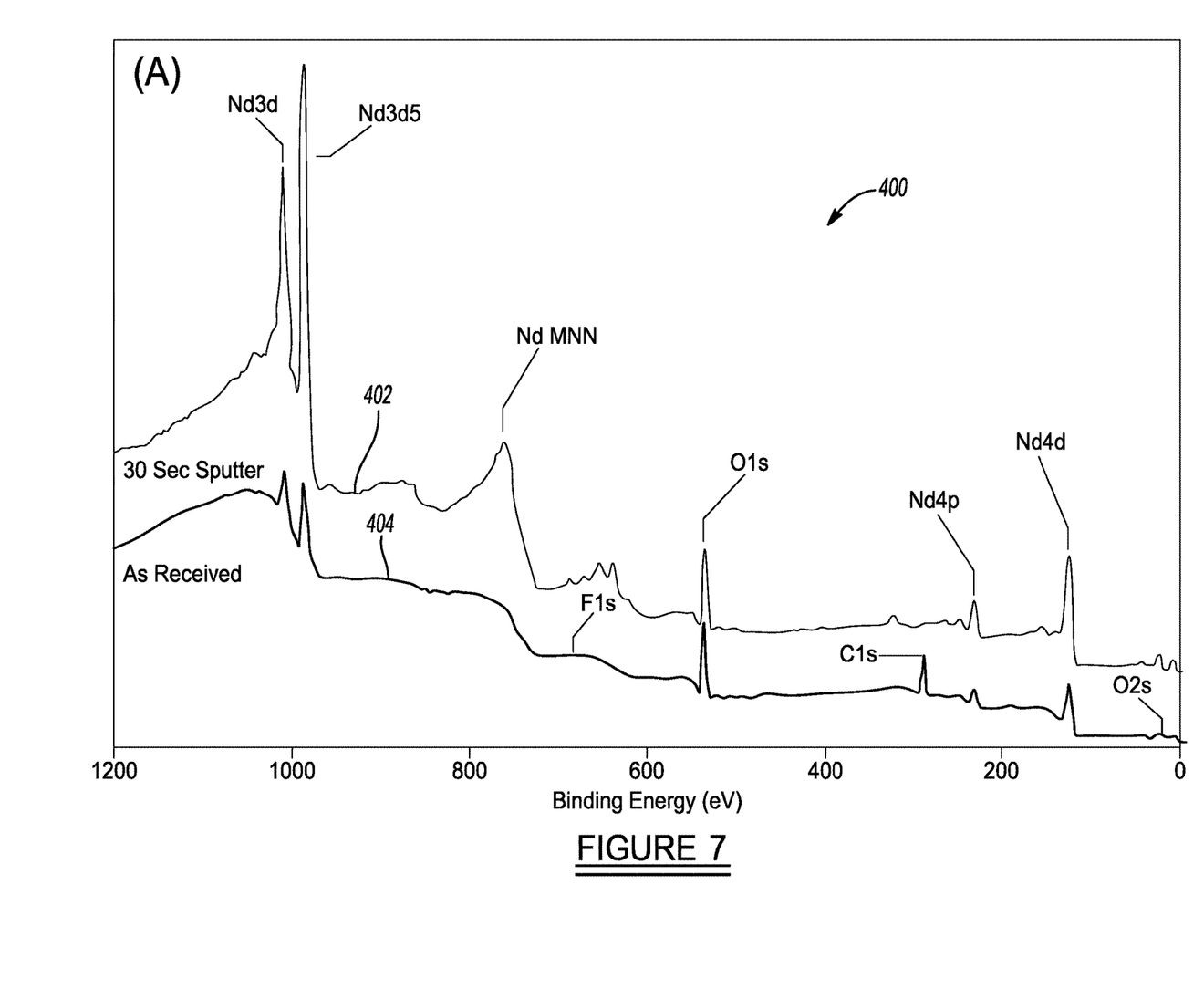
FIG. 7 shows a low resolution x-ray spectroscopy (XPS) scan before and after sputter etching the surface of a $Nd_2O_3$ film.
Figure 8:
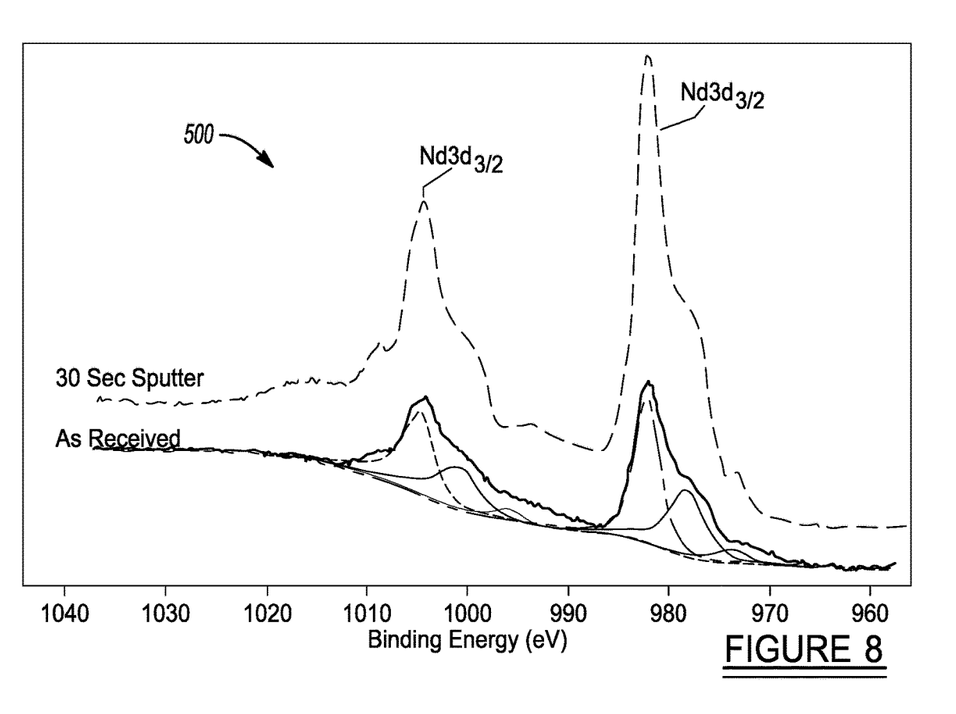
FIG. 8 shows a high resolution XPS scan and de-convolution of the Nd peak in the $Nd_2O_3$ film.
Figure 9:
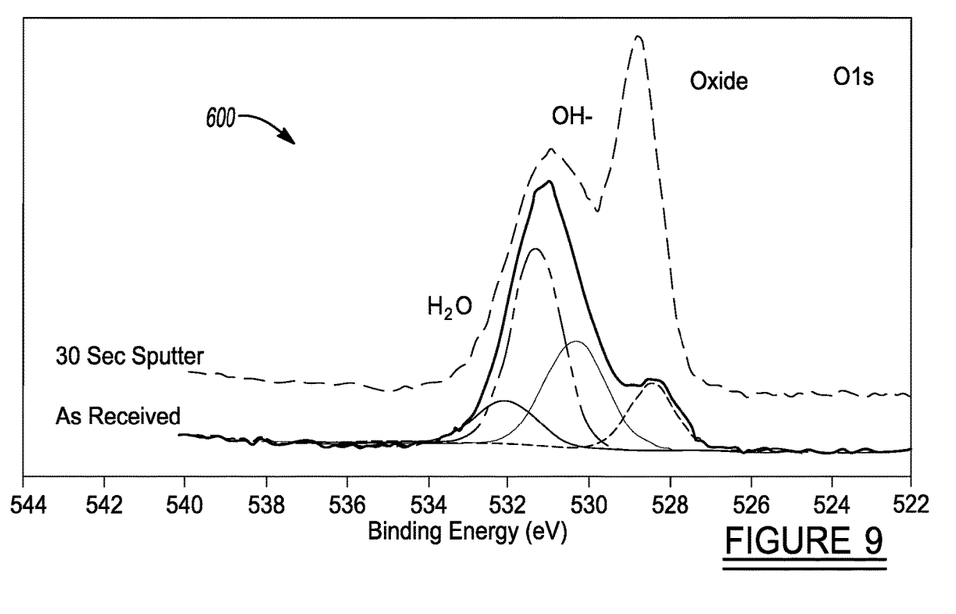
FIG. 9 shows a high resolution XPS scan and de-convolution of the oxygen peak in the $Nd_2O_3$ film.

FIGS. 5 and 6 show graphs 200 and 300, respectively, of the required thickness of $Nd_2O_3$ and $Al_2O_3$ for various particle sizes with different percentages of Nd indicated by curves 200-206 and 300-306. FIGS. 7-9 show graphs of binding energy vs. intensity from low and high resolution XPS scans to illustrate the feasibility of making stoichiometric $Nd_2O_3$ rare-earth thin films using the present system.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A method for applying a doping material on a quantity of powder particles, comprising:
    providing a controller;
    providing a stationary container having:
        an RF plasma generating subsystem disposed within the container and in communication with the controller;
        a central chamber having a first port for receiving a heated, precursor/carrier gas, a second port forming a vacuum port for enabling the container to be placed in a vacuum condition, and a third port for receiving an $O_2/O_3$ gas);
    locating a rotatable metal cylinder within the central chamber of the container, the rotatable cylinder being rotatable independently of the container;
    operatively coupling a rotation mechanism to the rotatable cylinder, the rotation mechanism being controlled via first control signals supplied from the controller;
    charging the rotatable cylinder with a quantity of powder particles;
    heating a quantity of precursor contained within a bubbler, the bubbler being independent of the container, to sublime the precursor;
    controlling a temperature of the bubbler, and rotation of the rotatable cylinder, using the controller;
    feeding a quantity of carrier gas into the bubbler and mixing the quantity of carrier gas with the heated precursor within the bubbler to form a mixture of heated precursor/carrier gas;
    charging the central chamber with the heated precursor/carrier gas through the first port in the container;
    using the rotation mechanism to cause rotational movement of the rotatable cylinder within the container while the container is held stationary to cause tumbling of the powder particles, to produce an interaction of the powder particles with the heated precursor/carrier gas within the rotatable cylinder to form a first monolayer coating on each of the powder particles;
    removing the heated precursor/carrier gas from the central chamber by using second control signals supplied from the controller to control a vacuum pump, the vacuum pump being in communication with the stationary container and activated by the controller upon the expiration of a predetermined time period, the predetermined time period being indicative that the first monolayer coating on each of the powder particles has been fully formed;
    charging the central chamber through the third port with a $O_2/O_3$ gas), and into a plasma generating subsystem;
    using the plasma generating subsystem to direct the $O_2/O_3$ gas) under a plasma into the rotatable cylinder, the plasma generating subsystem further being controlled by the controller; and
    causing further rotational movement of the rotatable cylinder while maintaining the container stationary, to cause further tumbling of the powder particles contained within the rotatable cylinder, to produce interaction of the $O_2/O_3$ gas) with the first monolayer coating on each said powder particle to modify the first monolayer coating to create a different, single monolayer coating forming an oxide coating on each of the powder particles, wherein the different, single monolayer coating forms a dopant for the powder particles.

2. The method of claim 1, wherein the oxide coating comprises at least one of a rare-earth oxide coating or an aluminum oxide coating.

3. The method of claim 1, wherein heating a quantity of precursor comprises heating a quantity of optically active organometallic precursor.

4. The method of claim 3, wherein heating a quantity of organometallic precursor comprises heating a quantity of $Nd(TMHD)_3$ material within the bubbler until the organometallic precursor sublimes.

5. The method of claim 1, wherein:
    heating a quantity of precursor within the bubbler comprises heating a quantity of $Nd(TMHD)_3$ material; and producing interaction of the $O_2/O_3$ gas) with the first monolayer coating produces a $Nd_2O_3$ monolayer on each of the powder particles.

6. The method of claim 1, further sintering the powder particles after creating the different monolayer coating on the powder particles.

7. The method of claim 1, wherein mixing a quantity of carrier gas with the heated precursor comprises mixing a quantity of argon with the heated precursor inside the bubbler.

8. The method of claim 1, wherein causing movement of the rotatable cylinder to cause interaction of the powder particles with the heated precursor/carrier gas comprises rotating the rotatable cylinder continuously.

9. The method of claim 1, wherein causing further movement of the rotatable cylinder to produce interaction of the $O_2/O_3$ gas) with the first monolayer coating on each powder particle comprises causing continuous rotation of the rotatable cylinder.

10. A method of doping a quantity of nano-powder particles, comprising:
   filling a container having a central chamber with a quantity of nano-powder particles;
   heating a quantity of optically active precursor to cause sublimation, to form a heated organometallic precursor;
   mixing a quantity of carrier gas with the heated optically active precursor to form a mixture of heated precursor/carrier gas;
   charging the central chamber with the heated precursor/carrier gas and causing rotation of the chamber to cause interaction of the nano-powder particles with the heated precursor/carrier gas to form a first monolayer coating on each of the nano-powder particles;
   removing the heated precursor/carrier gas from the central chamber and charging the central chamber with a $O_2/O_3$ gas) under a plasma;
   causing further rotation of the central chamber to produce interaction of the $O_2/O_3$ gas) with the first monolayer coating on each said nano-powder particle to modify the first monolayer coating to create a different, single monolayer coating forming a rare-earth oxide dopant coating on each of the nano-powder particles; and
   sintering the nano-powder particles to incorporate the rare-earth oxide dopant coating into a crystal lattice structure using the nano-powder particles.

11. The method of claim 10, wherein heating a quantity of optically active precursor to form an organometallic precursor comprises heating a quantity of $Nd(TMHD)_3$ material until the $Nd(TMHD)_3$ material sublimes.

12. The method of claim 10, wherein heating a quantity of optically active precursor to form an organometallic precursor comprises heating a quantity of $Nd(TMHD)_3$ material; and
   wherein producing interaction of the $O_2/O_3$ gas) with the first monolayer coating produces a $Nd_2O_3$ monolayer on each of the nano-powder particles.

13. The method of claim 10, wherein causing rotation of the chamber to cause interaction of the nano-powder particles with the heated precursor/carrier gas comprises causing rotation of the chamber continuously.

14. The method of claim 10, wherein causing further rotation of the central chamber to produce an interaction of the $O_2/O_3$ gas) with the first monolayer coating on each nano-powder particle comprises causing rotation of the chamber continuously.

15. The method of claim 10, wherein removing the heated precursor/carrier gas from the central chamber and charging the central chamber with a $O_2/O_3$ gas) under a plasma comprises charging the central chamber with a plasma having a power level of 0 watts-300 watts.

16. The method of claim 10, wherein removing the heated precursor/carrier gas from the central chamber and charging the central chamber with a $O_2/O_3$ gas) under a plasma comprises charging the central chamber with a plasma having a power level between 0 and 200 watts.

* * * * *